(12) United States Patent
Kim (10) Patent No.: US 9,276,169 B2
(45) Date of Patent: Mar. 1, 2016

(54) LIGHT EMITTING DEVICE, LIGHT EMITTING DEVICE PACKAGE, AND LIGHTING SYSTEM INCLUDING THE SAME

(75) Inventor: Sun Kyung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 488 days.

(21) Appl. No.: 12/908,413

(22) Filed: Oct. 20, 2010

(65) Prior Publication Data

US 2011/0095317 A1    Apr. 28, 2011

(30) Foreign Application Priority Data

Oct. 21, 2009    (KR) ........................ 10-2009-0100326

(51) Int. Cl.
*H01L 33/20* (2010.01)
*H01L 33/38* (2010.01)
*H01L 33/14* (2010.01)
*H01L 33/22* (2010.01)

(52) U.S. Cl.
CPC .............. *H01L 33/20* (2013.01); *H01L 33/382* (2013.01); *H01L 33/145* (2013.01); *H01L 33/22* (2013.01); *H01L 2224/48091* (2013.01); *H01L 2933/0083* (2013.01)

(58) Field of Classification Search
CPC ......... H01L 33/00; H01L 33/10; H01L 33/20; H01L 33/38; H01L 33/465; H01L 33/145
USPC .................. 257/79, 95, 98–100, 81, E33.005, 257/E33.074, 91; 438/22, 26, 27, 29
See application file for complete search history.

(56) References Cited

U.S. PATENT DOCUMENTS

| | | | |
|---|---|---|---|
| 6,410,942 B1* | 6/2002 | Thibeault et al. | 257/88 |
| 2003/0062530 A1 | 4/2003 | Okazaki et al. | |
| 2004/0207320 A1* | 10/2004 | Erchak | H01L 33/20 313/506 |
| 2005/0051782 A1* | 3/2005 | Negley et al. | 257/79 |

(Continued)

FOREIGN PATENT DOCUMENTS

| | | |
|---|---|---|
| EP | 1 995 794 A1 | 11/2008 |
| JP | 2003-101066 A | 4/2003 |

(Continued)

OTHER PUBLICATIONS

Zhou et al., "Vertical Injection thin-film AlGaN/AlGaN multiple-quantum-well deep ultraviolet light-emitting diodes," Appl. Phys. Lett. No. 89, American Institute of Physics (Dec. 13, 2006).

(Continued)

*Primary Examiner* — Daniel Whalen
*Assistant Examiner* — Suberr Chi
(74) *Attorney, Agent, or Firm* — Birch, Stewart, Kolasch & Birch, LLP (57) ABSTRACT

Provided are a light emitting device, a light emitting device package, and a lighting system including the same. The light emitting device includes a second electrode layerelectrode, a light emitting structure, a texture, and a current spreading layer. The light emitting structure is on second electrode layerelectrode, and includes a second conductive type semiconductor layer, an active layer on the second conductive type semiconductor layer, and a first conductive type semiconductor layer on the active layer. The texture is on at least one portion of the light emitting structure. The current spreading layer is on the light emitting structure provided with the texture.

18 Claims, 7 Drawing Sheets

(56) References Cited

U.S. PATENT DOCUMENTS

| | | |
|---|---|---|
| 2006/0175624 A1* | 8/2006 | Sharma et al. .................. 257/94 |
| 2006/0192217 A1 | 8/2006 | David et al. |
| 2006/0273341 A1 | 12/2006 | Lee et al. |
| 2007/0221907 A1* | 9/2007 | Jang et al. ....................... 257/13 |
| 2007/0221944 A1 | 9/2007 | Cheol Yoo |
| 2007/0257269 A1 | 11/2007 | Cho et al. |
| 2007/0267646 A1 | 11/2007 | Wierer, Jr. et al. |
| 2007/0290188 A1 | 12/2007 | Chuo et al. |
| 2008/0173887 A1 | 7/2008 | Baba et al. |
| 2008/0261340 A1* | 10/2008 | Matsuo et al. .................. 438/29 |
| 2009/0267092 A1 | 10/2009 | Fukshima et al. |
| 2010/0117109 A1* | 5/2010 | Unno ............................... 257/98 |
| 2010/0181591 A1 | 7/2010 | Suzuki |

FOREIGN PATENT DOCUMENTS

| | | |
|---|---|---|
| KR | 10-0588377 B1 | 6/2006 |
| KR | 10-2009-0018451 A | 2/2009 |
| WO | WO 2009/004740 A1 | 1/2009 |

OTHER PUBLICATIONS

Scherer et al., "Photonic Crystals for Confining, Guiding, and Emitting Light", IEEE Transactions on Nanotechnology, vol. 1, No. 1, pp. 4-11, XP011077066, Mar. 2002.

* cited by examiner

LIGHT EMITTING DEVICE, LIGHT EMITTING DEVICE PACKAGE, AND LIGHTING SYSTEM INCLUDING THE SAME

CROSS-REFERENCE TO RELATED APPLICATIONS

This application claims under 35 U.S.C. §119 to Korean Patent Application No. 10-2009-0100326 filed on Sep. 21, 2009.

BACKGROUND

Embodiments relate to a light emitting device, a light emitting device package, and a lighting system including the light emitting device and the light emitting device package.

In light emitting devices, P—N junction diodes having the properties of converting electrical energy into light energy may be formed by combining group III and V elements on the periodic table. Light emitting devices may implement various colors by controlling the composition ratio of compound semiconductors.

In light emitting devices, when a forward voltage is applied, an electron of an n-layer is combined with a hole of a p-layer to emit energy corresponding to an energy gap between the conduction band and the valance band. The energy is generally emitted in the form of heat or light. In light emitting devices, the energy is emitted in the form of light.

Nitride semiconductors, for example, are attracting much attention for the fields of optical devices and high-power electronic devices because of their high thermal stability and wide band gap energy. In particular, blue light emitting devices, green light emitting devices, and UV light emitting devices that use nitride semiconductors have been commercialized and are widely used.

Although a light extraction structure is used to improve a light extraction efficiency of a light emitting device in the related art, the light extraction efficiency does not reach an ideal value.

SUMMARY

Embodiments provide a light emitting device having high light extraction efficiency, a light emitting device package, and a lighting system including light emitting device and the light emitting device package.

Embodiments also provide a light emitting device that can obtain current spreading and resonant cavity effect, a light emitting device package, and a lighting system including light emitting device and the light emitting device package.

In one embodiment, a light emitting device comprises: an electrode layer; a light emitting structure on electrode layer, the light emitting structure comprising a second conductive type semiconductor layer, an active layer on the second conductive type semiconductor layer, and a first conductive type semiconductor layer on the active layer; a texture on at least one portion of the light emitting structure; and a current spreading layer on the light emitting structure provided with the texture.

In another embodiment, a light emitting device package comprises: a package body; the light emitting device on the package body; and an electrode in the package body, the electrode being electrically connected to the light emitting device.

In further another embodiment, a lighting system comprises a light emitting module comprising the light emitting device package.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package, and a lighting system including the same will be described with reference to accompanying drawings according to embodiments.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

[Embodiments]

Figure 1:
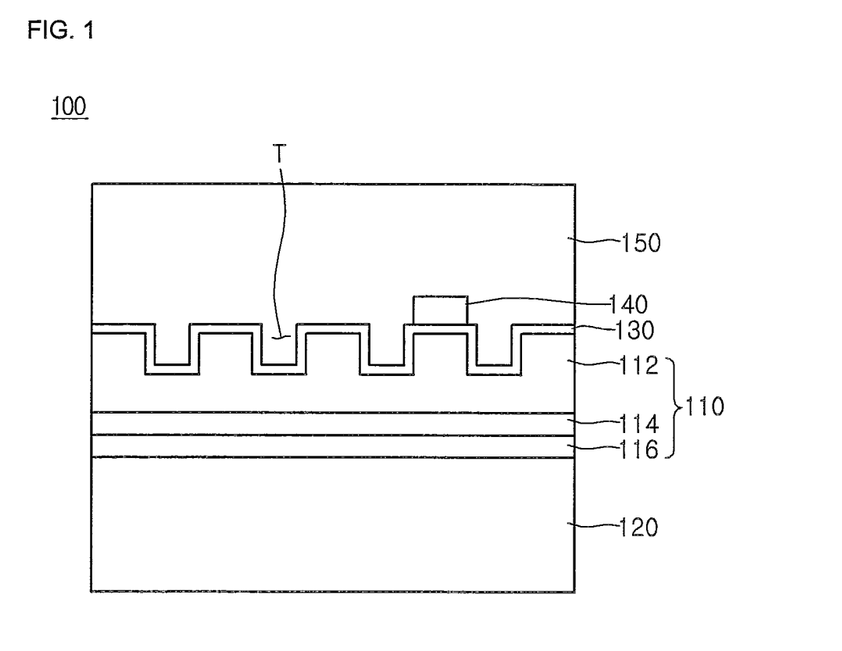
FIG. 1 is a vertical cross-sectional view illustrating a light emitting device according to a first embodiment.

FIG. 1 is a cross-sectional view illustrating a light emitting device 100 according to a first embodiment.

The light emitting device 100 may include a second electrode layer 120; a light emitting structure 110 disposed on the second electrode layer 120 and including a second conductive type semiconductor layer 116, an active layer 114, and a first conductive type semiconductor layer 112; a texture T disposed on the light emitting structure 110; and a current spreading layer 130 disposed on the first conductive type semiconductor layer 112 provided with the texture T. The texture T may be disposed on a portion of the first conductive type semiconductor layer 112, but the present disclosure is not limited thereto.

Figure 2:
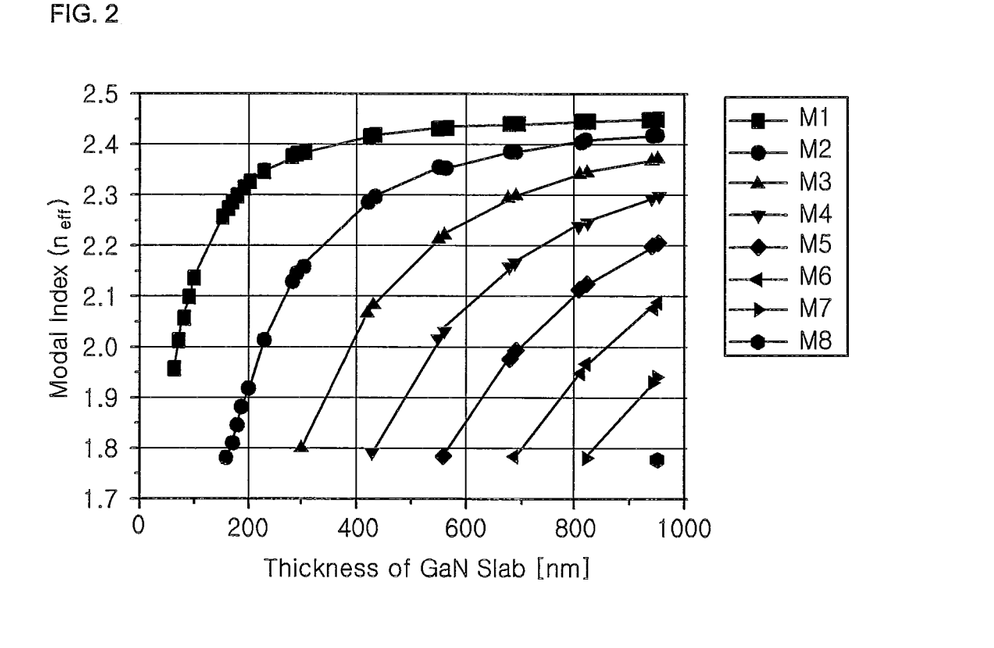
FIG. 2 is a graph illustrating variations in an effective refractive index according to thicknesses of a light emitting structure of a light emitting device according to an embodiment.

FIG. 2 is a graph illustrating variations in an effective refractive index according to thicknesses of a light emitting structure of a light emitting device according to an embodiment.

In the embodiment, a surface roughness or a periodic photonic crystal may be applied to a surface of the light emitting structure to improve a light extraction efficiency of the light emitting device.

In the related art, although this light extraction structure is used, light extraction efficiency does not reach an ideal value. This is because, when a light emitting device is considered as a waveguide, guided modes of various orders exist due to the thickness of the waveguide. That is, since an efficient extraction period is fixed for each guided mode, it is difficult to effectively extract all guided modes.

In addition, due to a high effective refractive index of a guide mode, a region where an electric field of a mode and a light extraction structure spatially overlap is limited.

To address this limitation, according to an embodiment, the thickness of a light emitting structure can be reduced down to $5 \times (\lambda/n)$ or less (where $\lambda$ is a light emitting wavelength and n is the refractive index of a light emitting structure). For example, the thickness of a light emitting structure can be reduced down to about 1 μm or less, but the present disclosure is not limited thereto.

When the thickness of a light emitting structure is decreased according to the embodiment, the number of guided modes existing according to the reduced thickness is decreased, an effective refractive index for guided modes of the same order is decreased, so that a spatial overlap with a light extraction structure is increased.

Thus, according to the embodiment, although the same light extraction structure is applied, as the thickness a light emitting structure decreases, the more improved extraction efficiency can be achieved.

A light emitting device and a method of manufacturing the same according to an embodiment have high light extraction efficiency, and a current spreading layer prevents an electric degradation.

A method of manufacturing a light emitting device will be described with reference to FIGS. 3 to 7 according to the first embodiment.

The light emitting device may be formed of a material such as GaN, GaAs, GaAsP, and GaP. For example, a green-blue LED may be formed of GaN(InGaN), and a yellow-red LED may be formed of InGaAlP or AlGaAs, furthermore, full colors can be achieved by varying a material composition.

Figure 3:
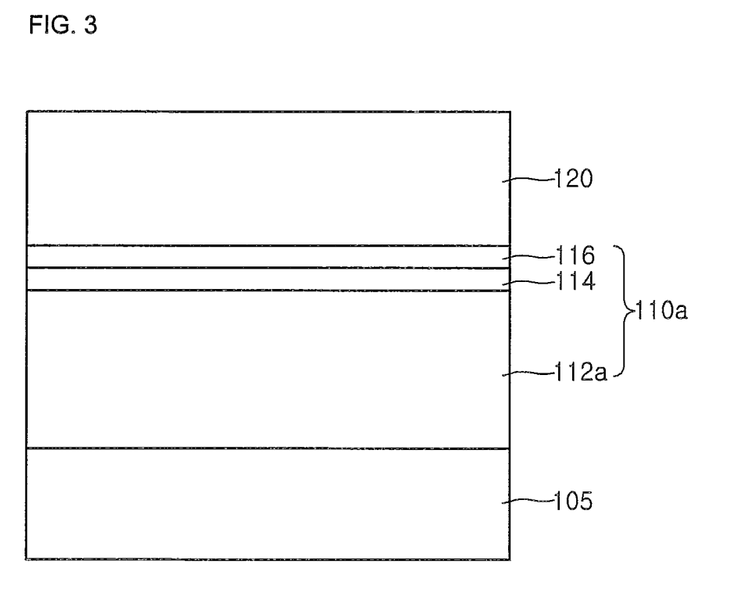
FIGS. 3 to 7 are cross-sectional views illustrating a method of manufacturing the light emitting device according to the first embodiment.

First, a first substrate 105 is prepared as illustrated in FIG. 3. The first substrate 105 includes a conductive substrate or an insulating substrate. For example, the first substrate 105 may include at least one of $Al_2O_3$, SiC, Si, GaAs, GaN, ZnO, Si, GaP, InP, Ge, and $Ga_2O_3$. A concave-convex structure may be disposed on the upper portion of the first substrate 105, but the present disclosure is not limited thereto. A wet cleaning operation may be performed on the first substrate 105 to remove impurities from the surface of the first substrate 105.

After that, a light emitting structure 110a including a first conductive type semiconductor layer 112a, the active layer 114, and the second conductive type semiconductor layer 116 may be formed on the first substrate 105.

A buffer layer (not shown) may be formed on the first substrate 105. The buffer layer reduces a lattice mismatch between the material of the light emitting structure 110a and the first substrate 105, and may be formed of group III-V compound semiconductor, for example, be formed of at least one of GaN, InN, AlN, InGaN, AlGaN, InAlGaN, and AlInN. An undoped semiconductor layer may be formed on the buffer layer, but the present disclosure is not limited thereto.

The first conductive type semiconductor layer 112a may be formed of group III-V compound semiconductor doped with a first conductive type dopant. When the first conductive type semiconductor layer 112a is an N type semiconductor layer, the first conductive type dopant may include Si, Ge, Sn, Se, or Te as an N type dopant, but the present disclosure is not limited thereto.

The first conductive type semiconductor layer 112a may include a semiconductor material having a composition equation of $In_xAl_yGa_{1-x-y}N$ ($0 \le x \le 1$, $0 \le y \le 1$, $0 \le x+y \le 1$).

The first conductive type semiconductor layer 112a may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112a may be formed as an N-type GaN layer by using a method such as chemical vapor deposition (CVD), molecular beam epitaxy (MBE), sputtering, or hydride vapor phase epitaxy (HVPE). The first conductive type semiconductor layer 112a may be formed by injecting silane ($SiH_4$) gas and n-type impurities such as trimethyl gallium (TMGa) gas, ammonia ($NH_3$) gas, nitrogen ($N_2$) gas, and silicon (Si) into a chamber.

In the current embodiment, an etch stop layer (not shown) may be formed in the first conductive type semiconductor layer 112a. Thus, an active layer is prevented from being exposed in a process of reducing the thickness of the light emitting structure 110, which will be performed later. For example, the etch stop layer may be formed of a material such as AlGaN, but the present disclosure is not limited thereto.

In the active layer 114, electrons injected through the first conductive type semiconductor layer 112 meet holes injected through the second conductive type semiconductor layer 116 to be formed later to emit light having energy determined by an energy band of the active layer 114.

The active layer 114 may have at least one of a single quantum well structure, a multi quantum well (MQW) structure, a quantum-wire structure, and a quantum dot structure. For example, the active layer 114 may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 114 may have a pair structure with at least one of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a lower band gap than that of the barrier layer.

A conductive type clad layer may be formed on at least one of the upper and lower sides of the active layer 114, and may be formed of AlGaN based semiconductor, and may have a higher band gap than that of the active layer 114.

The second conductive type semiconductor layer 116 may include group III-V compound semiconductor that is doped with a second conductive type dopant, e.g., include a semiconductor material having a composition equation of $In_xAl_yGa_{1-x-y}N$ ($0 \le x \le 1$, $0 \le y \le 1$, $0 \le x+y \le 1$). When the second conductive type semiconductor layer 116 is a P type semiconductor layer, the second conductive type dopant may include Mg, Zn, Ca, Sr, or Ba as a P type dopant.

The second conductive type semiconductor layer 116 may be formed as a p type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium ($EtCp_2Mg$){$Mg(C_2H_5C_5H_4)_2$} including p type impurities such as magnesium (Mg) into a chamber, but the present disclosure is not limited thereto.

In the embodiment, the first conductive type semiconductor layer 112a is an N type semiconductor layer, and the second conductive type semiconductor layer 116 is a P type semiconductor layer, but the present disclosure is not limited thereto. A layer of an opposite conductive type semiconductor to the second conductive type semiconductor, e.g., of an N type semiconductor layer (not shown) may be formed on the second conductive type semiconductor layer 116. Accordingly, the light emitting structure 110a may have one of an N—P junction structure, a P—N junction structure, an N—P—N junction structure and a P—N—P junction structure.

Thereafter, the second electrode layer 120 is formed on the second conductive type semiconductor layer 116.

The second electrode layer 120 may include an ohmic layer (not shown), a reflective layer (not shown), a coupling layer (not shown), and a second substrate (not shown). The second electrode layer 120 may be formed of at least one of titanium (Ti), chrome (Cr), nickel (Ni), aluminum (Al), platinum (Pt), gold (Au), tungsten (W), or a semiconductor substrate to which impurities are injected.

For example, the second electrode layer 120 may include an ohmic layer (not shown) that is may be formed by stacking a single metal or a metal alloy, and a metal oxide in multi layers to efficiently inject holes. For example, the ohmic layer may include at least one of ITO(indium tin oxide), IZO(indium zinc oxide), IZTO(indium zinc tin oxide), IAZO(indium aluminum zinc oxide), IGZO(indium gallium zinc oxide), IGTO(indium gallium tin oxide), AZO(aluminum zinc oxide), ATO(antimony tin oxide), GZO(gallium zinc oxide), IZON(IZO Nitride), AGZO(Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but the present disclosure is not limited thereto.

When the second electrode layer 120 includes a reflective layer, the reflective layer may be a metal layer including Al, Ag, or an alloy including Al or Ag. Aluminum or silver effectively reflects light emitted from an active layer to significantly improve the light extraction efficiency of a light emitting device.

When the second electrode layer 120 includes a coupling layer, the reflective layer may be function as the coupling layer, or the coupling layer may be formed of nickel (Ni) or gold (Au).

The second electrode layer 120 may include a second substrate. If the first conductive type semiconductor layer 112a has a sufficient thickness of 50 μm or greater, a process of forming the second substrate may be omitted. The second substrate may be formed of a metal, a metal alloy, or a conductive semiconductor material, which has high electric conductivity, to efficiently inject holes.

For example, the second substrate may selectively include copper (Cu), copper alloy, gold (Au), nickel (Ni), copper-tungsten (Cu—W), and a carrier wafer (e.g., GaN, Si, Ge, GaAs, ZnO, SiGe, and SiC).

Methods of forming the second substrate may include an electrochemical metal deposition method and a bonding method using a eutectic metal.

Figure 4:
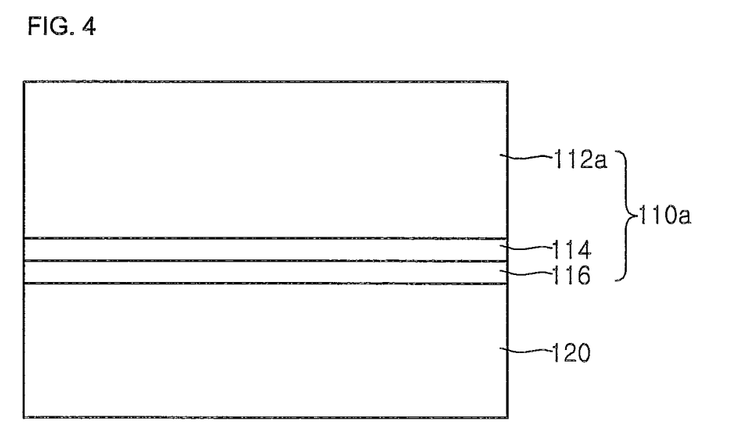

Thereafter, referring to FIG. 4, the first substrate 105 is removed to expose the first conductive type semiconductor layer 112a. The first substrate 105 may be removed using a high power laser or a chemical etch method.

Figure 5:
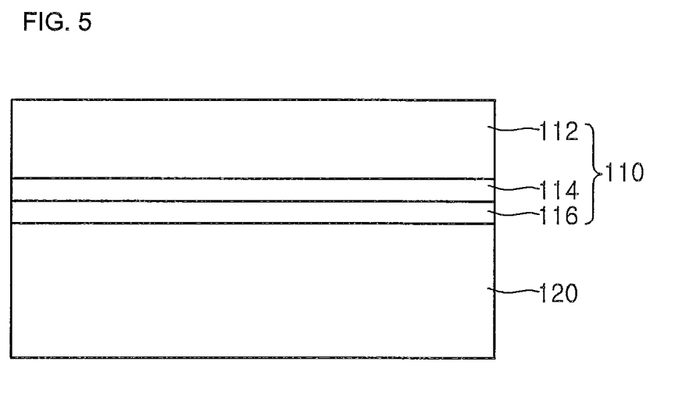

Next, referring to FIG. 5, the thickness of the first conductive type semiconductor layer 112a is decreased. To decrease the thickness of the first conductive type semiconductor layer 112a, the thickness of the light emitting structure 110 may be decreased by performing dry etching or wet etching on the region from the first conductive type semiconductor layer 112a to the etch stop layer (not shown). Accordingly, the active layer 114 is prevented from being exposed.

According to the embodiment, the thickness of the light emitting structure 110 can be reduced down to $5 \times (\lambda/n)$ or less (where $\lambda$ is a light emitting wavelength and n is the refractive index of a light emitting structure). For example, the thickness of a light emitting structure can be reduced down to about 1 μm or less, but the present disclosure is not limited thereto. When the thickness of a light emitting structure is decreased according to the embodiment, the number of guided modes existing according to the reduced thickness is decreased, and an effective refractive index for guided modes of the same order is decreased, so that a spatial overlap with a light extraction structure is increased.

Thus, according to the embodiment, although the same light extraction structure is applied, as the thickness of a light emitting structure decreases, the more improved extraction efficiency can be achieved.

Figure 6:
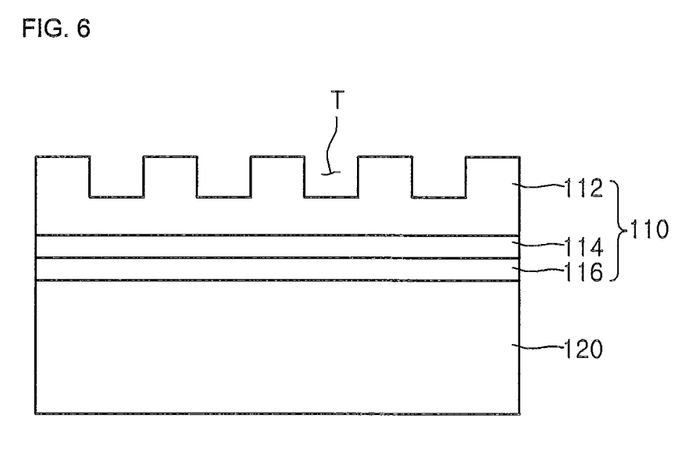

Next, referring to FIG. 6, the texture T may be formed on the first conductive type semiconductor layer 112 having the decreased thickness. The texture T may be a convex-concave structure or a photonic crystal structure, but the present disclosure is not limited thereto.

Figure 7:
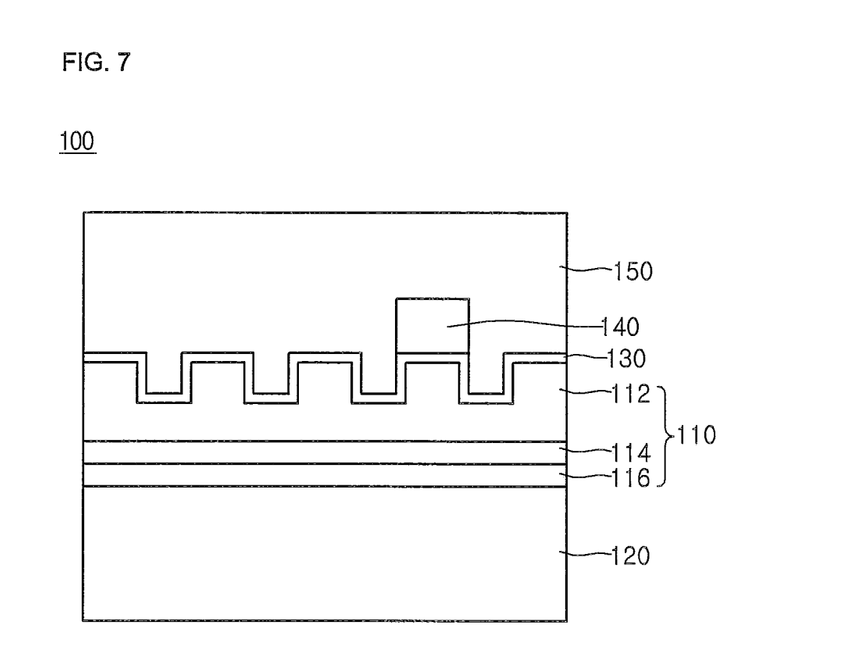

Next, referring to FIG. 7, the current spreading layer 130 may be formed on the first conductive type semiconductor layer 112 provided with the texture T.

According to the current embodiment, the current spreading layer 130 may be disposed on the first conductive type semiconductor layer 112 to prevent a current spreading degradation due to a loss of the first conductive type semiconductor layer 112. A transparent electrode applied to the first conductive type semiconductor layer 112 may have a thickness about 30 nm or greater to spread a current, but the present disclosure is not limited thereto.

Thereafter, a first electrode layer 140 may be formed on the current spreading layer 130. Thereafter, a coating member 150 is formed, and a phosphor (not shown) may be added to the coating member 150 if necessary.

For example, the coating member 150 may be formed on the upper side of the light emitting structure 110 or on the upper side of the current spreading layer 130. For example, the coating member 150 including a phosphor may be formed through a conformal coating process on the light emitting structure 110 or the current spreading layer 130.

For example, to form a white LED, LEDs of red, green and blue, which are the three primary colors of light, may be combined, or a yellow phosphor (not shown) such as yttrium aluminum garnet (YAG) and terbium aluminum garnet (TAG) may be added to a blue LED, or a (red/green/blue) three-colored phosphor may be used in a UV LED.

The light emitting device and the method of manufacturing the same according to the embodiment have high light extraction efficiency, and the current spreading layer prevents an electric degradation.

Figure 8:
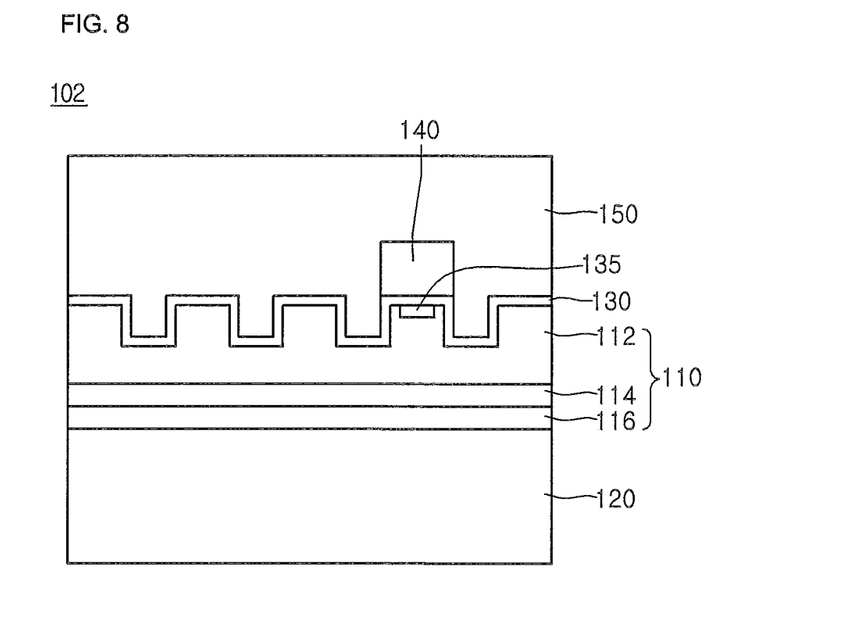
FIG. 8 is a vertical cross-sectional view illustrating a light emitting device according to a second embodiment.

FIG. 8 is a cross-sectional view illustrating a light emitting device 102 according to a second embodiment.

The second embodiment may use the technical characteristics of the first embodiment, and different characteristics of the second embodiment from the first one will be described principally.

According to the second embodiment, after the texture T is formed on the first conductive type semiconductor layer 112, a current blocking layer 135 may be formed on a portion of the first conductive type semiconductor layer 112 provided with the texture T.

The current blocking layer 135 may include at least one of a dielectric layer, a second conductive type ion implantation layer, a second conductive type spreading layer, a non-conductive type layer, and an amorphous layer.

In FIG. 8, the current blocking layer 135 includes a second conductive type ion implantation layer, a second conductive type spreading layer, or an amorphous layer in the surface of the first conductive type semiconductor layer 112, but the present disclosure is not limited thereto.

Figure 9:
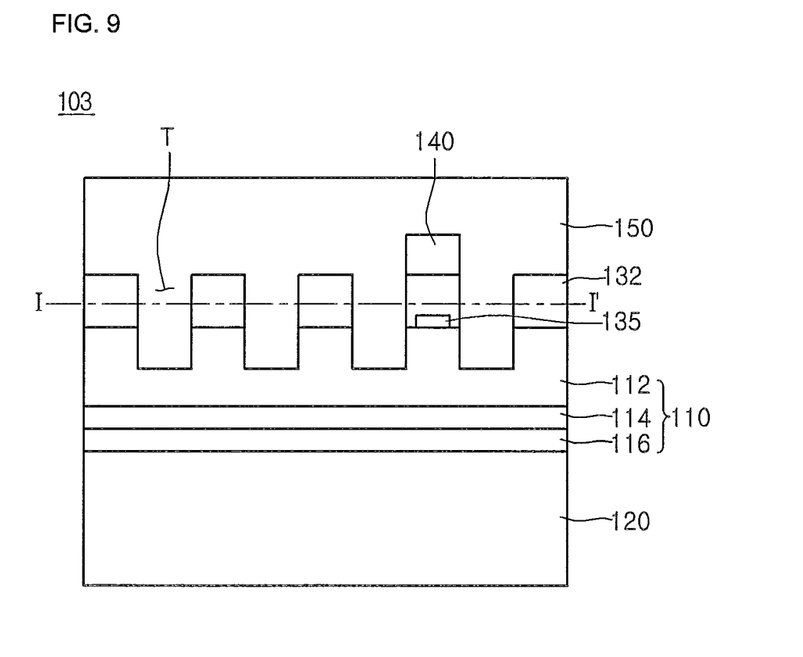
FIG. 9 is a vertical cross-sectional view illustrating a light emitting device according to a third embodiment

For example, as illustrated in FIG. 9, the current blocking layer 135 may be formed as a dielectric layer on the first conductive type semiconductor layer 112. For example, the current blocking layer 135 (refer to FIG. 9) of the dielectric layer may be formed of an oxide, a nitride, or a fluoride on a portion of the first conductive type semiconductor layer 112.

Alternatively, for example, a mask pattern (not shown) exposing a portion of the first conductive type semiconductor layer 112 is formed, and the mask pattern is used as a mask to perform an ion implantation process with second conductive type ions, thereby forming the second conductive type ion implantation layer.

Alternatively, a mask pattern (not shown) exposing a portion of the first conductive type semiconductor layer 112 may be formed, and the mask pattern may be used as a mask to inject protons having high kinetic energy to a portion of the first conductive type semiconductor layer 112 such that lattice collision breaks a mono crystalline state to form an amorphous layer having high electrical resistance.

Thereafter, the current spreading layer 130 is formed, and then, the first electrode layer 140 may be formed on the current spreading layer 130 in a region vertically and partially corresponding to the current blocking layer 135.

According to the second embodiment, since the current blocking layer is formed at the lower end of the region provided with the first electrode layer, the portion of the active layer at the lower end of the first electrode layer is excluded from a light emitting operation. Thus, the amount of light absorbed to the first electrode layer can be reduced. A light absorption reduction effect of the first electrode layer, obtained by adjusting a current density, can be more effectively exhibited in a thin film light emitting device of 1 μm or less.

Figure 10:
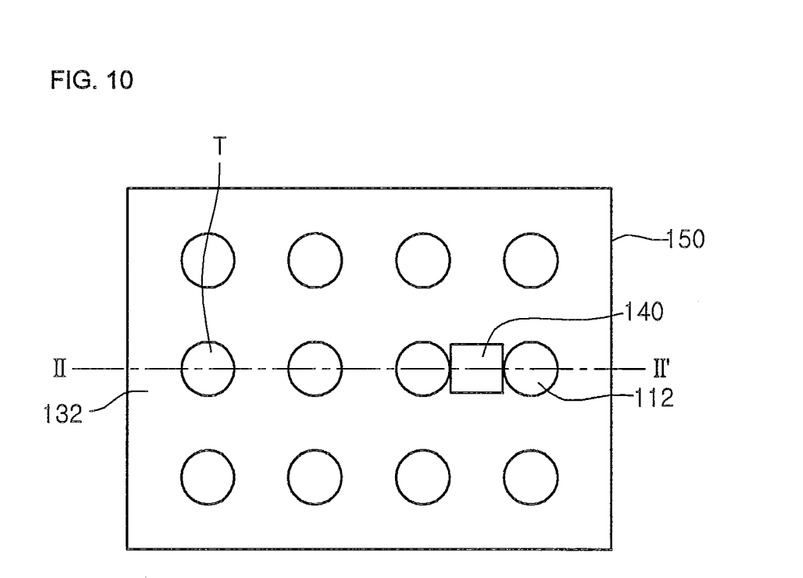
FIG. 10 is a horizontal cross-sectional view illustrating the light emitting device according to the third embodiment.

FIG. 9 is a vertical cross-sectional view illustrating a light emitting device 103 according to a third embodiment, and FIG. 10 is a horizontal cross-sectional view illustrating the light emitting device 103 according to the third embodiment. For example, FIG. 9 is a vertical cross-sectional view taken along the line II-II' of FIG. 10, and FIG. 10 is a horizontal cross-sectional view taken along the line I-I' of FIG. 9.

The third embodiment may use the technical characteristics of the first and second embodiments, and different characteristics of the third embodiment from the first and second ones will be described principally.

According to the third embodiment, a current spreading layer 132 may be formed before forming the texture T on the first conductive type semiconductor layer 112, and the current spreading layer 132 may be disposed on the first conductive type semiconductor layer 112 except for a region in which the texture T is disposed.

For example, the current spreading layer 132 is formed by forming a current spreading layer material on the first conductive type semiconductor layer 112. For example, a transparent electrode material such as indium tin oxide (ITO) may be formed on the first conductive type semiconductor layer 112.

Thereafter, the texture T may be formed by removing a portion of the current spreading layer material and a portion of the first conductive type semiconductor layer 112. Accordingly, the current spreading layer 132 can be formed on the first conductive type semiconductor layer 112 except for the region provided with the texture T.

According to the third embodiment, when light extraction structures of a thin film light emitting device are formed by arranging a plurality of holes, if the current spreading layer 132 such as a transparent electrode is disposed on the upper surface of a protruding region of the light extraction structure, a current spreading effect can be obtained, and each light extraction structure can function as a resonant cavity LED. This effect can be achieved also when a thin film light emitting device, that is, a light emitting structure has a thickness of $5\times(\lambda/n)$ or less (where $\lambda$ is a light emitting wavelength and n is the refractive index of a light emitting structure).

Figure 11:
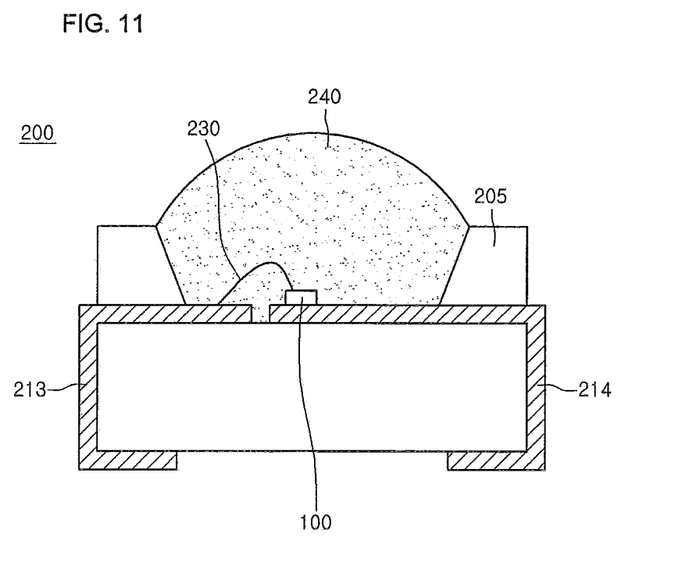
FIG. 11 is a cross-sectional view illustrating a light emitting device package according to an embodiment.

FIG. 11 is a cross-sectional view illustrating a light emitting device package provided with a light emitting device according to an embodiment.

Referring to FIG. 11, the light emitting device package according to the current embodiment includes a body 205, a third electrode layer 213 and a fourth electrode layer 214 disposed in the body 205, a light emitting device 100 disposed in the body 205 and electrically connected to the third electrode layer 213 and the fourth electrode layer 214, and a molding member 240 surrounding the light emitting device 100.

The body 205 may be formed of a silicon material, a synthetic resin material, or a metal material. An inclined surface may be disposed around the light emitting device 100.

The third electrode layer 213 and the fourth electrode layer 214 are electrically separated from each other and supply a power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be the vertical type light emitting device exemplified in FIG. 1, but the present disclosure is not limited thereto, and thus, the light emitting device 100 may be the light emitting device 102 of FIG. 8, the light emitting device 103 of FIG. 9, or a horizontal type light emitting device.

The light emitting device 100 may be disposed on the body 205 or on the third electrode layer 213 or the fourth electrode layer 214.

The light emitting device 100 may be electrically connected to the third electrode layer 213 and/or the fourth electrode layer 214 through a wire 230. In the embodiment, the vertical type light emitting device 100 and one wire 230 are used as an example, but the present disclosure is not limited thereto.

The molding member 240 may surround the light emitting device 100 to protect the light emitting device 100. The molding member 240 may include a phosphor to vary a wavelength of light emitted form the light emitting device 100.

The light emitting device package according to the embodiment may be applicable to a lighting system. The lighting system may include a lighting unit illustrated in FIG. 12 and a backlight unit illustrated in FIG. 13. In addition, the lighting system may include traffic lights, a vehicle headlight, and a sign.

Figure 12:
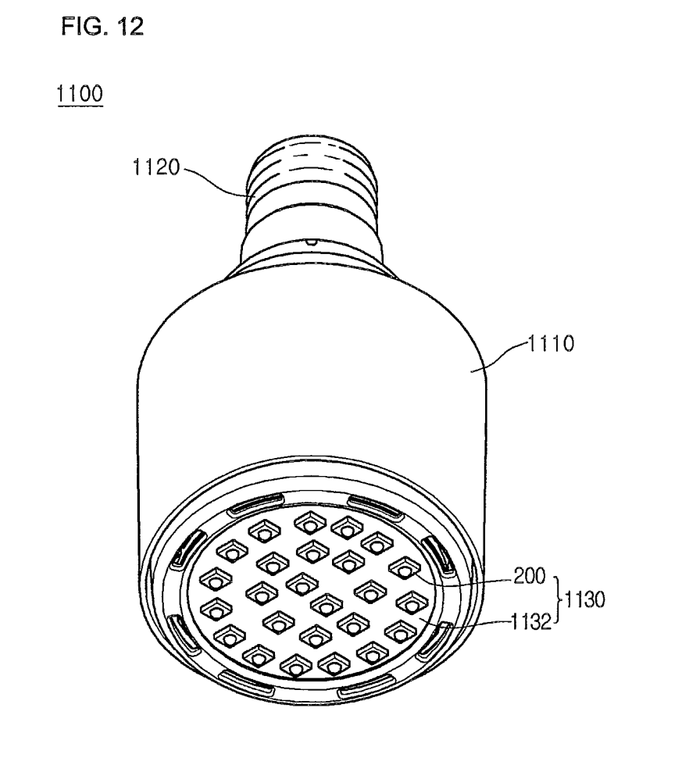
FIG. 12 is a perspective view of a lighting unit according to an embodiment.

FIG. 12 is a perspective view of a lighting unit 1100 according to an embodiment.

Referring to FIG. 12, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 200 may be mounted on the substrate 1132. The light emitting device package 200 may include at least one light emitting diode (LED) 100. The light emitting diode 100 may include a colored light emitting diode that emits red, green, blue, or white light, and an UV light emitting diode that emits ultraviolet (UV) light.

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. As shown in FIG. 12, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 13:
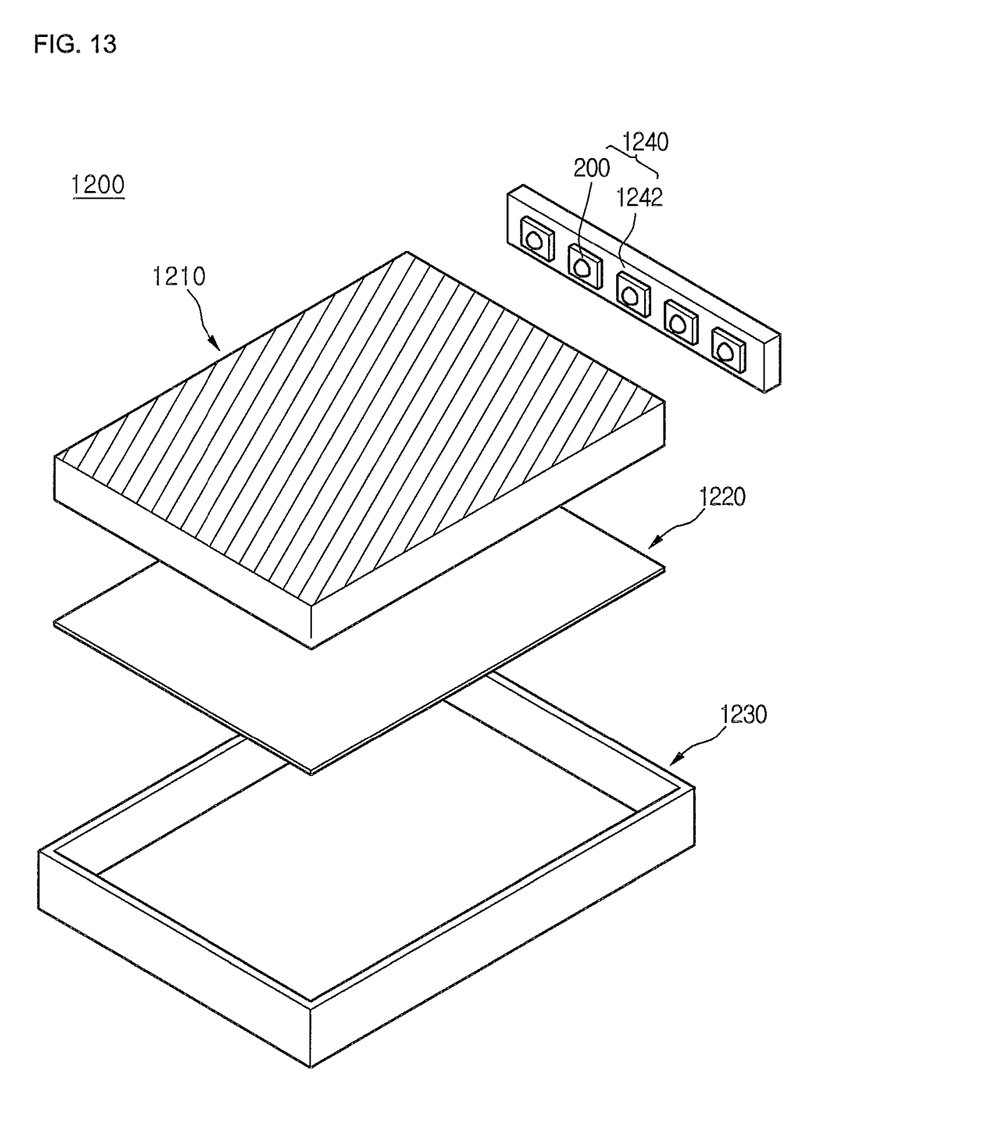
FIG. 13 is an exploded perspective view of a backlight unit according to an embodiment.

FIG. 13 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of LIGHT EMITTING DEVICE packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The light emitting device packages 200 may have light emitting surfaces that emit light on the substrate 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a second electrode layer;
    a light emitting structure on the second electrode layer, the light emitting structure comprising a second conductive type semiconductor layer, an active layer on the second conductive type semiconductor layer, and a first conductive type semiconductor layer on the active layer;
    a texture on at least one portion of the light emitting structure;
    a current spreading layer formed directly on the light emitting structure provided with the texture;
    a first electrode layer on the current spreading layer; and
    a coating member on the upper side of the current spreading layer, wherein the texture is formed in an upper surface of the first conductive type semiconductor layer, wherein a vertical cross section of the texture comprises a first direction and a second direction being different from the first direction, wherein the first direction and the second direction are substantially perpendicular, wherein the texture comprises a plurality of protruding portions and a plurality of groove portions, wherein the plurality of protruding portions are connected to each other, wherein the coating member is disposed to surround the first electrode layer, and wherein the coating member comprises phosphor, and wherein a top surface of the first electrode layer is lower than a top surface of the coating member;

wherein the current spreading layer comprises a plurality of protruding portions and a plurality of groove portions.

2. The light emitting device of claim 1, wherein the texture is disposed on at least one portion of the first conductive type semiconductor layer of the light emitting structure.

3. The light emitting device of claim 2, comprising a current blocking layer at one portion of the first conductive type semiconductor layer provided with the texture.

4. The light emitting device of claim 3, wherein the first electrode layer on the current spreading layer is in a region vertically and partially corresponding to the current blocking layer.

5. The light emitting device of claim 4, wherein the current blocking layer comprises at least one of a dielectric layer, a second conductive type ion implantation layer, a second conductive type spreading layer, a non-conductive type layer, and an amorphous layer.

6. The light emitting device of claim 1, wherein the light emitting structure has a thickness of $5\times(\lambda/n)$ or less, where $\lambda$ is a wavelength of the active layer, and n is a refractive index of the light emitting structure.

7. The light emitting device of claim 1, comprising an etch stop layer in the first conductive type semiconductor layer.

8. The light emitting device of claim 1, wherein the active layer is not exposed by the texture.

9. The light emitting device of claim 1, wherein the current spreading layer is disposed on an entire region of the light emitting structure provided with the texture.

10. The light emitting device of claim 1, wherein the current spreading layer is disposed on the first conductive type semiconductor layer except for a region provided with the texture.

11. A light emitting device package comprising:
a package body;
the light emitting device of claim 1 on the package body; and
an electrode in the package body, the electrode being electrically connected to the light emitting device.

12. A lighting system comprising a light emitting module comprising the light emitting device package of claim 11.

13. The light emitting device of claim 1, wherein the first electrode layer is disposed directly on the current spreading layer.

14. The light emitting device of claim 1, wherein the current spreading layer is disposed on the first conductive type semiconductor layer except for a region provided with the texture, and the first electrode layer is disposed on the first conductive type semiconductor layer except for the region provided with the texture.

15. The light emitting device of claim 1, wherein the texture comprises a rectangular shape vertical cross section.

16. The light emitting device of claim 1, wherein the first electrode layer is formed on only a protruding portion of the texture.

17. The light emitting device of claim 1, wherein the coating member contacts the top surface of the first electrode layer.

18. The light emitting device of claim 1, wherein the coating member contacts a side surface of the first electrode layer.

* * * * *